(12) United States Patent
Park et al.

(10) Patent No.: US 6,303,450 B1
(45) Date of Patent: Oct. 16, 2001

(54) CMOS DEVICE STRUCTURES AND METHOD OF MAKING SAME

(75) Inventors: Heemyong Park, LaGrangeville; Anda C. Mocuta, Wappinger Falls; Werner Rausch, Stormville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/717,971

(22) Filed: Nov. 21, 2000

(51) Int. Cl.[7] .................................................. H01L 21/336
(52) U.S. Cl. .................... 438/300; 438/301; 438/302; 438/303; 438/305; 438/306; 438/307; 438/308
(58) Field of Search .................................. 438/300–308, 438/286, 981

(56) References Cited

U.S. PATENT DOCUMENTS

| | | | |
|---|---|---|---|
| 5,079,180 | * 1/1992 | Rodder et al. | 438/300 |
| 5,093,275 | * 3/1992 | Tasch, Jr. et al. | 438/300 |
| 5,116,780 | * 5/1992 | Samata et al. | 438/300 |
| 5,413,946 | * 5/1995 | Hong | 438/261 |
| 5,504,031 | * 4/1996 | Hsu et al. | 438/300 |
| 5,970,351 | * 10/1999 | Takeuchi | 438/301 |
| 6,184,098 | * 2/2001 | Noguchi | 438/301 |
| 6,190,977 | * 2/2001 | Wu | 438/300 |

* cited by examiner

Primary Examiner—John F. Niebling
Assistant Examiner—Lynne A. Gurley
(74) Attorney, Agent, or Firm—Eric W. Petraske; Cantor Colburn LLP

(57) ABSTRACT

Disclosed is a method comprising providing a silicon surface with an underlying insulator layer, providing a plurality of gates adjacent to source/drain regions, growing source/drains between the said gates such that the source/drains are thicker in regions of larger gate-to-gate pitch, and doping the source/drains with one or more dopants such that the dopants abut the underlying insulator layer.

15 Claims, 2 Drawing Sheets

CMOS DEVICE STRUCTURES AND METHOD OF MAKING SAME

FIELD OF THE INVENTION

This invention relates to improved CMOS devices.

BACKGROUND OF THE INVENTION

The manufacture of complementary metal oxide semiconductors (CMOSs), such as metal oxide semiconductor field effect transistors (MOSFETs) is well known in the art. However, as the envelope of the technology is pushed to higher performance and the size of the transistors scaled down, three major problems have been identified, namely canyon effects, facet effects of selective epitaxy, and lateral redistribution of dopants.

Canyon effects appear in stacked MOSFET configurations, such as in a series of NFETs, for example, without source or drain metal contacts. In such cases the amount of doping for deep source and drain is affected by the distance between adjacent gates (i.e., the gate-to-gate pitch). As gate-to-gate pitch decreases, so does the deep source/drain (S/D) doping. When source/drain dopants are implanted through the smaller opening between the adjacent gates, the less amount of dopant is introduced into the S/D region, which tends to diffuse outwardly and significantly reduce the peak concentration of dopant. In forming the S/D doping in silicon-on-insulator (SOI) substrates, the less-doped S/D regions in a smaller gate-to-gate pitch causes serious problems such as incomplete junction isolation between the adjacent devices due to incomplete butting of S/D doping against the SOI buried oxide interface, as a function of the gate-to-gate pitch. The result is current leakage between adjacent devices and degraded performance and irregularity in circuit operation with such devices.

Facet effects occur as the result of building up raised source/drain (RSD) structures in an effort to avoid silicide contact formation problem in SOI devices and potentially reduce S/D resistance. The RSD structure is desired for higher performance characteristics. At present, there is poor control over the facet that is formed at the gate sidewall because of the difference in epitaxy growth rates as a function of crystal orientation and spacer geometry. Faceting of the crystal is a thermodynamic artifact of the minimization of free energy. Various facets are formed at the silicon dioxide ($SiO_2$) gate sidewall depending on sidewall orientation and growth conditions, particularly during epitaxy of silicon or silicon germanium (SiGe). The uncontrollable variation in facet shapes and contours interferes with critical doping by implantation, usually necessitating application of extension and halo doping prior to epitaxy of the RSD. The result is degraded short channel behavior because the extension and halo dopants exhibit transient enhanced diffusion (TED) during the thermal process of selective epi.

Lateral redistribution of extension and halo dopants results in aggravated short channel effects, particularly when scaling the gate length to under 0.1 micron. The most obvious short channel effect is threshold voltage (Vt) rolloff. A number of theoretical studies indicate that Vt rolloff can only be improved by providing a sharper lateral gradient of halo doping, which would require the reduction or elimination of TED of halo dopant during activation annealing of deep submicron scale devices. This is particularly a problem with boron or indium for NFET halo, which is known to diffuse out significantly from S/D sides at gate lengths as short as 0.1 microns.

This invention is a method of making CMOS structures at deep submicron scale that exhibit substantially reduced canyon effects, facet effects, and lateral dopant diffusion.

SUMMARY OF THE INVENTION

Disclosed is a method comprising providing a silicon surface with an underlying insulator layer, providing a plurality of gates adjacent to source/drain regions, growing source/drains between said gates such that said source/drains are thicker in regions of larger gate-to-gate pitch, and doping said source/drains with one or more dopants such that said dopants abut said underlying insulator layer.

DETAILED DESCRIPTION OF THE INVENTION

Figure 1:
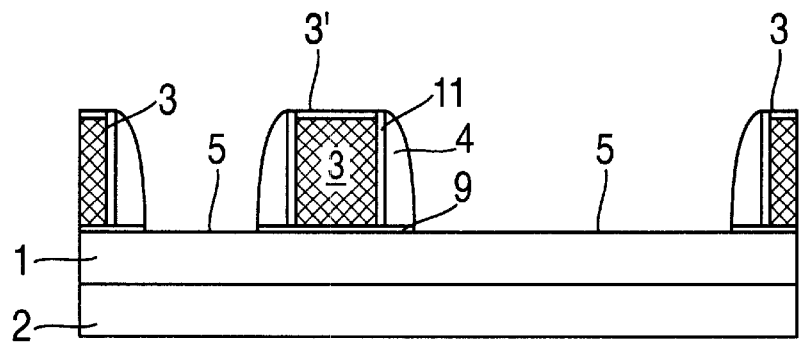
FIGS. 1 through 8 show various steps of the process.

Referring to FIG. 1 there is shown a typical SOI (Silicon-On-Insulator) wafer comprising a silicon layer 1 over an underlying insulator layer, here a buried oxide insulator layer 2. A plurality of raised structures, here gates 3, are provided that define regions 5 therebetween that will be used to construct source/drains in the examples shown. Also shown are nitride liners 3' covering the gates 3, surrounded by a removable first spacer 4. The removable first spacers are used actively in the semiconductor art, and can be composed of polysilicon or nitride, or a composite using both materials. Normally, the nitride liner is formed by LPCVD (Liquid-Phase Chemical Vapor Deposition). Generally, the first spacer will be about 200 to about 1000 angstroms thick and determines the source/drain extension 9 length. In another embodiment, a thinner oxide inner spacer 11 may be formed so as to provide a buffer layer in the S/D extension design and to protect the gate from any damage during removal of the removable first spacer 4.

Figure 2:
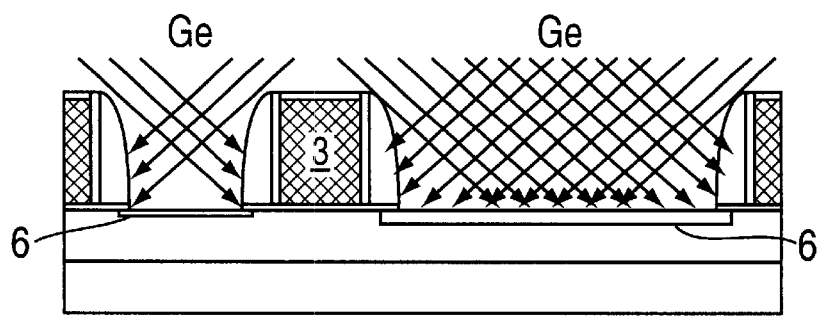

Referring to FIG. 2, the source/drain regions 5 adjacent to the gates 3 are doped with a growth accelerator. The doping may be angled to get sidewall coverage. A suitable growth accelerant for silicon epitaxy is germanium. FIG. 2 shows an angled germanium implant with a total dose of from 1E14 to 1E17 ($cm^{-2}$), such as from 1E15 to 2E16 ($cm^{-2}$). There will necessarily be higher concentrations of the growth accelerant implant 6 in regions of greater gate-to-gate pitch, such as that region 5 shown on the right in the drawings. The angled implant may be effected, for example, by rotating the wafer and executing four implants at four different tilts (e.g., top, bottom, left, and right). The tilt angle will generally be chosen according to the aspect ratio (gate height/gate length) of the gates and the minimum gate-to-gate pitch. By this means, one may achieve higher surface concentrations of, for example, germanium (Ge), in the regions of greatest gate-to-gate pitch. The difference in surface concentrations can be as much as two times between regions of small and large gate-to-gate pitch. Low energy implantation (1 to 5 keV) is preferred so as to achieve higher surface concentrations of Ge and to avoid the formation of defects in the final anneal. It is desirable to follow up the implantation with a rapid thermal annealing at a temperature of at least 800° C. so as to recrystallize the surface that may have been amorphized by the Ge implants.

Figure 3:
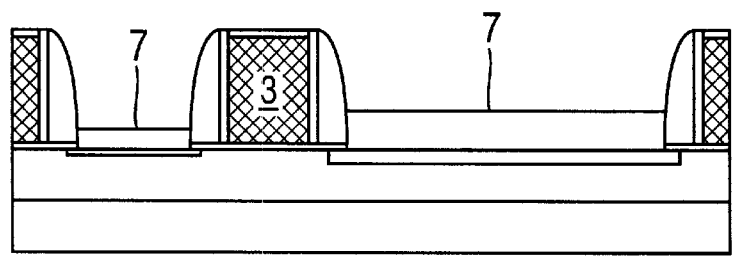

Referring to FIG. 3, after the growth accelerant implant, a silicon epitaxy is applied so as to raise the source/drains 7 from about 50 to about 300 angstroms. The epitaxy will typically be effected at a temperature of from 500° to 800° C. Note that the epitaxy produces thicker layers 7 in regions of larger gate-to-gate pitch. It is known that SiGe growth rates increase significantly with increasing concentrations of Ge, particularly at low temperatures (e.g., below 600° C., such as around 500° C.) and low pressures and therefore makes germanium a useful growth accelerant for silicon epitaxy. This is believed to occur because the hydrogen desorption rate is higher on surfaces with high Ge concentrations. When growing silicon on a germanium-rich surface, Ge segregation to the growth front occurs thereby enhancing the growth rate of the film. Growth rate enhancements of up to 300% are obtainable on pure Ge surfaces. The result is that the regions with the greatest distances between gates 3 will build up higher and faster because these regions have the highest Ge concentration from the previous step.

Figure 4:
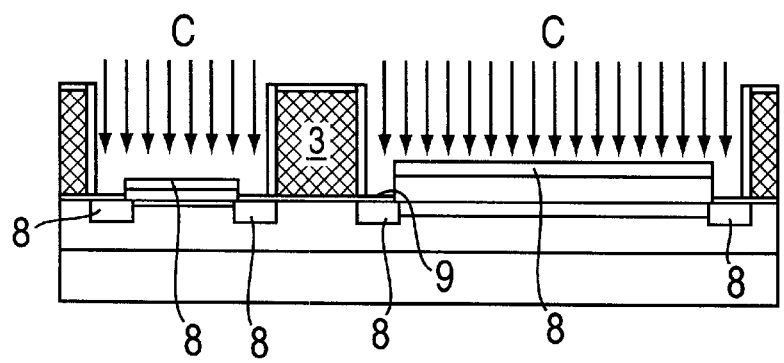

Referring to FIG. 4, the first spacers 4 are removed and diffusion inhibitor implants 8 provided in the extension regions and on the surfaces of the raised sources/drains 7. The first spacers 4 can be removed by various processes, such as hot phosphoric acid with diluted HF. Any facet shape variations from the source/drain epitaxy are unimportant here because the critical contour of the implant surface is defined by the gate edge. Where boron and/or phosphorous are used as dopants, carbon will be found useful as a diffusion inhibitor implant 8. The carbon implant will serve to form carbon-doped Si or SiGe only at the extension region 9 where suppression of transient enhanced diffusion of boron is required. Carbon is known to inhibit the diffusion of boron and phosphorus because of its interstitial trapping mechanisms. Implantation of even small amounts of carbon in silicon or SiGe layers is known to reduce boron diffusion by up to two orders of magnitude. Taking advantage of this fact, the process described herein can achieve relatively steep gradients of boron halo for NFETs and phosphorous halo for PFETs. It should be noted that carbon has the opposite effect on arsenic and antimony, that is to say that diffusion of these dopants is enhanced by carbon. To avoid this effect on arsenic halo in PFETs, it is desirable to mask the PFET active region before carbon implantation.

Figure 5:
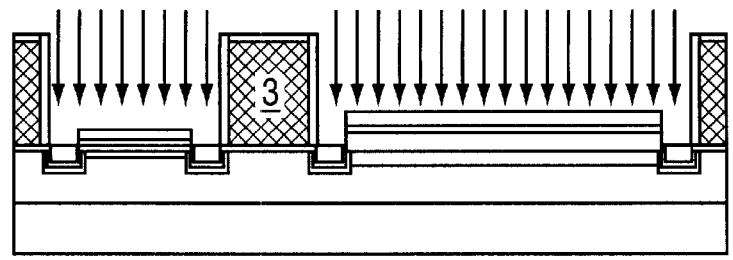

In FIG. 5, the extension and halo implants are provided. For an NFET device the implants will generally be arsenic extension and boron halo (or boron difluoride, $BF_2$), while PFETs will usually be produced with $BF_2$ extension (or boron) and arsenic halo (or phosphorous) implants.

Figure 6:
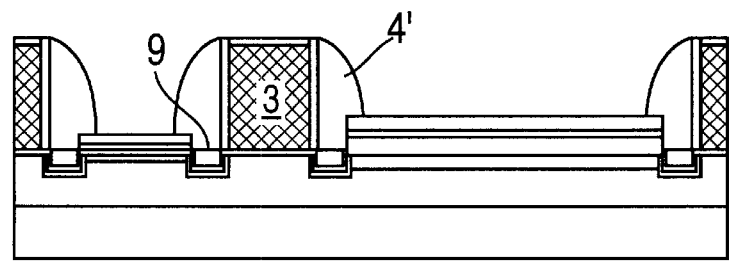

Referring to FIG. 6, after doping, a second set of oxide spacers 4' are provided to cover the extension regions 9 and the facets of the raised source/drains 7. A method of providing the second spacers 4' is by plasma-enhanced chemical vapor deposition, such as at temperatures below 600° C. Low-temperature methods may be utilized to avoid annealing and diffusion of the dopants. The second spacers 4' is sized so as to cover the facet of the raised source/drains 7, thereby eliminating any facet effects during subsequent doping procedures.

Figure 7:
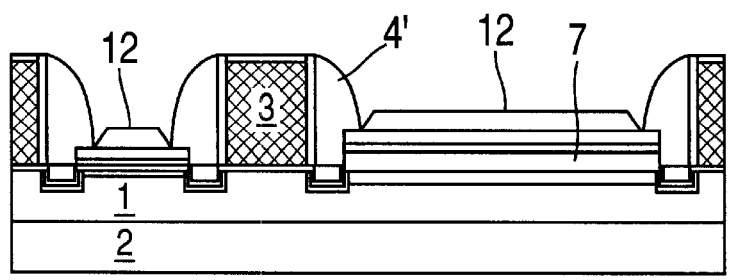

Referring to FIG. 7, a second epitaxy 12 can be executed with either selective silicon or SiGe, though this step is optional. It may be desired to further increase the thickness of the source/drains so as to reduce S/D series resistance and to avoid problems in silicide contact formation on thin SOI devices. It is preferred that from 50 to 300 angstroms, such as from 100 to 200 angstroms, of additional material 12 be deposited on the source/drains 7, depending on the thickness of SOI layer. The second epitaxy will generally be conducted at temperatures of from 400° to 650° C., such as from 500° to 550° C., for SiGe epi at low pressures. Note that the final thickness of the raised source/drain is thicker in the regions of larger gate-to-gate pitch. Note also that the implanted carbon is now sandwiched between the first 7 and second 12 epitaxy layers. Normally, sheet resistance and contact resistivity of the carbon-implanted Si or SiGe layers can increase after silicidation due to the effect of carbon. By adding the second epitaxy and sandwiching the carbon inside the entire layer, the problem of increased resistance of the carbon-implanted S/D epilayer is avoided.

Figure 8:
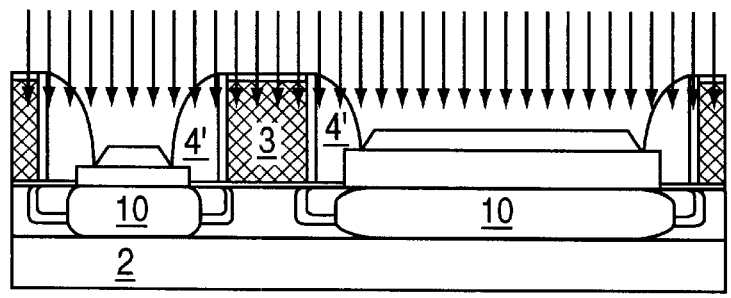

Referring to FIG. 8, the final step in the manufacturing process before silicidation is to implant deep source/drain dopants 10 and then activate them with rapid thermal annealing at temperatures of about 1000° C. or whatever temperature is deemed effective for that purpose. This deep doping will be deep enough to abut the buried oxide layer 2. Because the material buildup in the smaller gate-to-gate pitch regions is thinner than in the larger gate-to-gate pitch regions, the dopant will more easily penetrate the former. Because the dopant penetrates more deeply, it will abut the buried oxide layer 2 and thereby reduce the canyon effect. The presence of carbon prevents lateral diffusion of the boron and phosphorous dopants, and the facet effect is eliminated because any critical facets from the first epilayer are covered by a spacer 4. Note also that the deep source/drain junctions will be more uniformly butted against the buried oxide layer 2 across different sizes of stack devices.

It is to be understood that all physical quantities disclosed herein, unless explicitly indicated otherwise, are not to be construed as exactly equal to the quantity disclosed, but rather about equal to the quantity disclosed. Further, the mere absence of a qualifier such as "about, or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A method of making semiconductor structures, comprising:
   providing a silicon surface with an underlying insulator layer;
   providing a plurality of gates adjacent to source/drain regions;
   growing source/drains between said gates such that said source/drains are thicker in regions of larger gate-to-gate pitch; and
   doping said source/drains with one or more dopants such that said dopants abut said underlying insulator layer.

2. The method of claim 1 wherein said act of growing source/drains between gates further comprises:
   implanting a growth accelerant in said source/drain regions in greater concentrations in regions of larger gate-to-gate pitch.

3. The method of claim 2 wherein said act of implanting growth accelerant further comprises an angled implant.

4. The method of claim 2 wherein said growth accelerant is germanium.

5. The method of claim 1 wherein said underlying insulator layer is a buried oxide layer.

6. The method of claim 1 wherein said one or more dopants is selected from arsenic, phosphorous, boron, and boron diflouride.

7. The method of claim 1 further comprising providing first spacers adjacent to said gates so as to form extension regions adjacent to said gates.

8. The method of claim 7 further comprising:

removing said first spacers after growing said source/drains; and implanting a diffusion inhibitor in said extension regions.

9. The method of claim 8 wherein said diffusion inhibitor comprises carbon.

10. The method of claim 8 further comprising providing second spacers adjacent to said gates so as to cover said extension regions and facets of said source/drains.

11. The method of claim 10 further comprising:

providing extension and halo implants; and growing additional source/drain material upon said source drains after having provided said second spacers.

12. The method of claim 11 further comprising annealing said dopants.

13. A method of making semiconductor structures, comprising:

providing a semiconductor substrate with a plurality of raised first structures thereon, said first structures separated by regions of varying first structure-to-first structure pitch;

means for growing second structures in said regions such that the rate of growth of said second structures is greater in regions of greater first structure-to-first structure pitch.

14. The method of claim 13 further comprising:

means for protecting facets of said second structures; and growing additional semiconductor material upon said second structures.

15. The method of claim 13 wherein said means for growing said second structures further comprises:

means for implanting growth accelerant in said regions;

said growth accelerant implanted in greater concentrations in regions of greater first structure-to-first structure pitch.

* * * * *